United States Patent [19]

Kato et al.

[11] Patent Number: 4,965,630
[45] Date of Patent: Oct. 23, 1990

[54] PROJECTION EXPOSURE APPARATUS

[75] Inventors: Kinya Kato, Yokohama; Kazuo Ushida; Toshiyuki Namikawa, both of Tokyo; Koichi Matsumoto, Kita; Kyoichi Suwa; Koichi Ohno, both of Yokohama, all of Japan

[73] Assignee: Nikon Corporation, Tokyo, Japan

[21] Appl. No.: 451,166

[22] Filed: Dec. 15, 1989

[30] Foreign Application Priority Data

Dec. 21, 1988 [JP] Japan ................................ 63-320616

[51] Int. Cl.$^5$ .............................................. G03B 27/68
[52] U.S. Cl. ......................................... 355/52; 355/53
[58] Field of Search ..................................... 355/52, 53

[56] References Cited

U.S. PATENT DOCUMENTS 3,655,260 4/1972 Bartucci et al. .................... 355/52
3,980,405 9/1976 Tatsuno et al. ..................... 355/52

FOREIGN PATENT DOCUMENTS 61-151 1/1986 Japan .

Primary Examiner—Monroe H. Hayes
Attorney, Agent, or Firm—Shapiro and Shapiro

[57] ABSTRACT

The present invention provides a projection exposure apparatus comprising: a reticle stage; an illumination optical system for illuminating a reticle on the reticle stage; a stage on which a substrate is supported; and a projection optical system having a predetermined numerical aperture to project a pattern formed on the reticle and illuminated by the illumination optical system onto the substrate, and in which a longitudinal spherial aberration thereof regarding the focusing of the pattern formed on the reticle onto the substrate are excessively corrected.

8 Claims, 3 Drawing Sheets

PROJECTION EXPOSURE APPARATUS

BACKGROUND OF THE INVENTION

1. Field of the Invention

The present invention relates to a projection exposure apparatus used in a process for manufacturing semi-conductor elements, and more particularly, it relates to a projection optical system for a reduction projection exposure apparatus.

2. Related Background Art

In the past, a reduction projection exposure apparatus has been used for manufacturing a semi-conductor element having a micro-pattern, such as LSI, VLSI and the like, and considerable effort has been made to improve for transferring a more minute pattern correctly and stably. For example, the improvements regarding the use of light having shorter wavelength and the increase of NA (numerical aperture) of a projection optical system to expose a wafer have been still continued. Further, in order to stably transfer such minute pattern, it is requested that not only the resolving power of the projection optical system must be excellent but also the contrast of the projected image must be high, and, therefore, the effort to find the optimum exposure condition by examining various illumination conditions for illuminating the reticle has been made. With respect to the illumination condition, a technique in which NA (numerical aperture) of the illumination optical system and NA of the projection optical system are adjusted to obtain a proper balance between the resolving power and the contrast regarding a given pattern by adjusting a so-called $\sigma$ value corresponding to a ratio of the NA of the illumination optical system to the NA of the projection optical system has already been known, for example, as disclosed in the Japanese Utility Model Laid-Open No. 61-151.

However, in the conventional apparatus disclosed in the above-mentioned Japanese Utility Model Laid-Open No. 61-151, although the illumination optical system is improved in some extent, since the more the NA of the projection optical system is increased the shallower the depth of focus, there arose a problem that, due to the severe or critical focus registration condition for exposing and transferring the minute pattern on the reticle onto the wafer, the pattern could not be correctly transferred to the wafer even when slight variation in focusing occurred. Further, in most cases, since the transfer pattern has not a single cyclic texture or structure, but a plurality of different minute structures, in ordinary projection optical systems, the best focus position tends to be fluctuated in accordance with widths of lines in the minute pattern. Accordingly, the severe adjustment and control had to be performed in the manufacturing process, for example, since the best focus position varies in accordance with the degree of the minuteness of the pattern to be transferred.

Consequently, in the process for manufacturing the VLSI and the like, it was always requested for performing the very critical focus detection and reliable correction of the focus position, thus making the apparatus large-sized, extending the operation time and decreasing the through-put.

SUMMARY OF THE INVENTION

Accordingly, an object of the present invention is to provide a projection exposure apparatus which can transfer various minute patterns having different line widths more stably, without reducing a resolving power of a projection optical system so much.

In order to achieve the above object, the projection exposure apparatus according to the present invention is characterized by an illumination optical system for illuminating a reticle, and a projection optical system having a predetermined NA for projecting a pattern of the reticle on a wafer and being designed that spherical aberration regarding the focusing of the pattern of the reticle onto the wafer becomes excessive correction.

In this case, the projection optical system may include a spherical aberration changing means for changing a longitudinal amount of the spherical aberration of the projection optical system in accordance with an illumination condition, degree of minuteness of the reticle pattern, a thickness of a photoresist and the like.

Further, it is desirable that the longitudinal amount $\Delta S$ of the spherical aberration is excessively corrected to meet the following condition:

$$0 < \Delta S < 5\lambda/NA^2$$

Here, NA is a numerical of aperture of the projection optical system, and $\lambda$ is a wavelength of exposure light of the illumination optical system.

Since the projection exposure apparatus according to the present invention is constructed as mentioned above, it is possible to transfer the minute pattern having different line widths from the reticle onto the wafer more stably than the conventional apparatuses, without reducing the resolving power of the projection optical system so much.

Other objects, features and advantages of the present invention will be apparent from the following description referring to the accompanying drawings.

DESCRIPTION OF THE PREFERRED EMBODIMENTS

The present invention will now be fully explained in connection with embodiments thereof with reference to the accompanying drawings.

Figure 1:
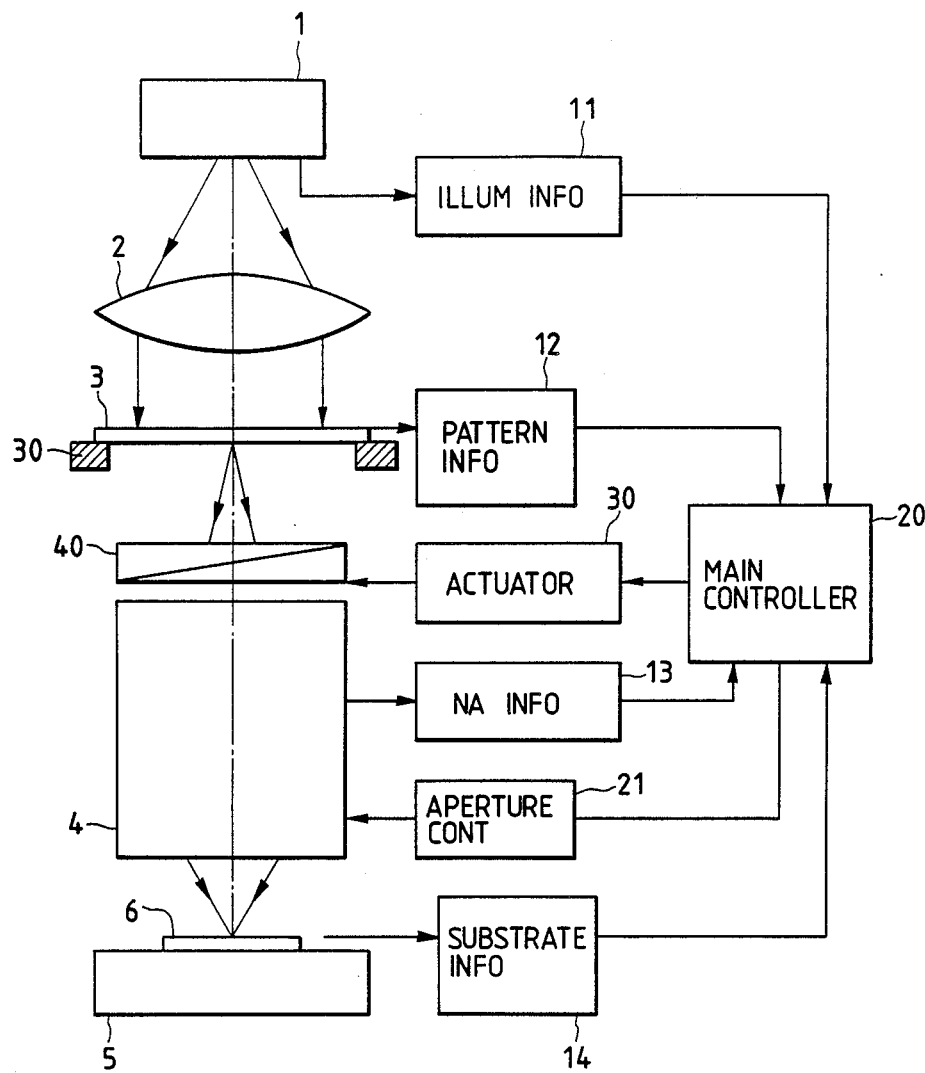
FIG. 1 is a schematic constructional view showing an exposure apparatus of reduction projection type, according to a preferred of the present invention.

FIG. 1 shows an exposure apparatus of reduction projection type according to a embodiment of the present invention, where a predetermined projection pattern is formed on a reticle 3 supported on a reticle stage 30. Exposure illumination light emitted from an illumination optical device 1 including an exposure light source uniformly illuminates the reticle 3 through a condenser lens 2. The illuminated pattern on the reticle 3 is reduction-projected onto a wafer 6 supported on a wafer stage 5, through a spherical aberration changing optical system 40 and a reduction projection objective lens 4.

Now, the spherical aberration regarding the focusing of the reticle pattern on the wafer effected by the reduction projection objective lens 4 of the projection optical system constituting a main portion of the present invention will be explained.

By examining exposure conditions regarding various photo-resist in various illumination conditions in order to eliminate the above-mentioned conventional drawbacks, it was found the following matters. That is to say, with respect to the resolution of the minute pattern eventually formed on the wafer by photolithography, regarding a photosensitive member such as a photoresist having a substantial thickness, since a multi-reflection occurs therein, there is a limitation in improvement of the resolving power in the condition that the focusing ability of the projection optical system has no aberration, and, thus, the resolving power increases in the condition that the longitudinal spherical aberration is excessive in some extent; and, the projection optical system having no aberration has a tendency that the best focus position varies in accordance with the minuteness of the pattern, and, thus, is unfavorable for the stability of total depth of focus regarding the patterns having various minutenesses. In consideration of these circumstances, the present invention is achieved.

That is to say, the present invention provides a projection exposure apparatus comprising an illumination optical system for illuminating a reticle having a predetermined pattern thereon, and a projection optical system having a predetermined numerical aperture (NA) to project the pattern of the reticle onto a wafer, and wherein spherical aberration regarding the focusing of the pattern of the reticle on the wafer by means of the projection optical system is excessively corrected.

Further, the projection exposure apparatus includes a spherical aberration changing means for changing a longitudinal amount of the spherical aberration of the projection optical system in accordance with an illumination condition, minuteness of the reticle pattern, thickness of a photoresist and the like.

It was found that it was desirable for the longitudinal amount $\Delta S$ of the spherical aberration of the projection optical system occurring in the focusing of reticle pattern on the wafer to meet the following requirement:

$$0 < \Delta S < 5\lambda/NA^2 \quad (1)$$

Here, $\lambda$ is a wavelength of the exposure light for projecting the pattern of the reticle onto the wafer, and NA is a numerical aperture of the projection optical system.

With the arrangement as mentioned above, by making the spherical aberration of the projection optical system in the excessive correction condition, the depth of focus is substnatially increased without reducing the resolving power so much. To the contrary, in a so-called full correction condition of the spherical aberration, which was considered to be ideal in the past, although the resolving power is increased, it was found that the depth of focus was reduced to make the focusing ability in the relative movement between the projection optical system and the best focus position unstable. Further, it was found that, even when the pattern to be transferred involves different minute pattern areas, the variation of the best focus position due to the difference in minuteness would be reduced and the best focus position became more stable if the spherical aberration was excessively corrected.

Figure 2A:
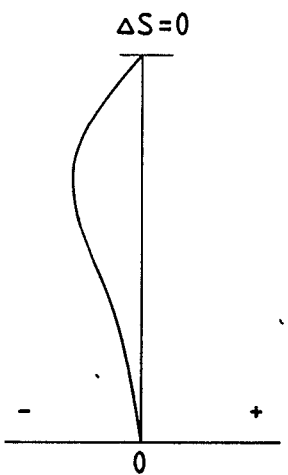
FIGS. 2A, 2B and 2C are graphs showing spherical aberration, indicating three correction conditions of the spherical aberration of an objective lens for projection.
Figure 2B:
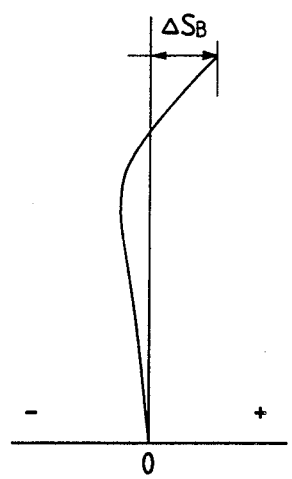
Figure 2C:
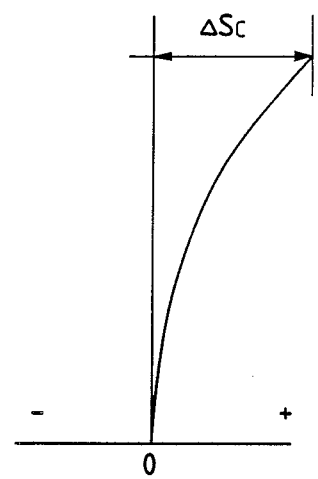
Figure 3A:
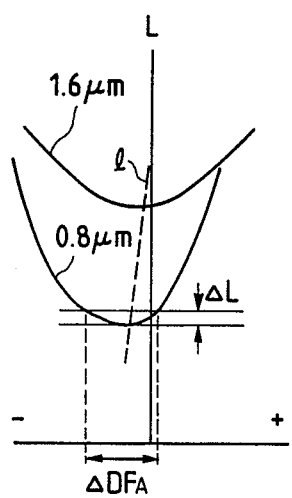
FIGS. 3A, 3B, and 3C are graphs for explaining Critical Dimension - Forcus Curve of the projection objective lens corresponding to the three correction conditions of FIG. 2.
Figure 3B:
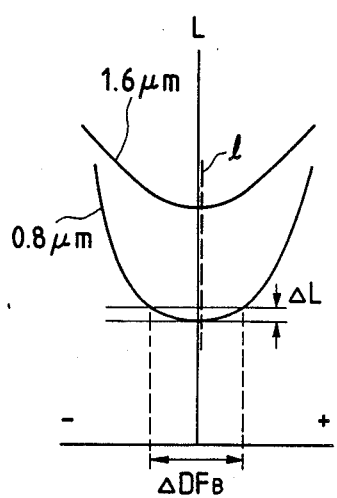
Figure 3C:
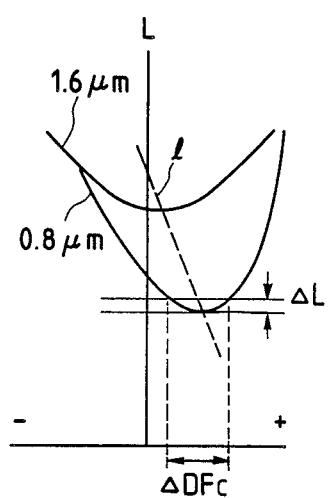

Such conditions are shown in FIGS. 2 and 3. FIG. 2 shows the correction conditions of the spherical aberration, where FIG. 2A shows a so-called full correction condition of the spherical aberration, FIG. 2B shows the excessive correction condition of the spherical aberration, and FIG. 2C shows the condition that the spherical aberration is more excessively corrected. On the other hand, FIG. 3 shows the relation between the line width of the pattern to be exposure-transferred onto the wafer and the focus deviation, as a curve in the graph having an abscissa indicating an amount $\Delta DF$ of the focus deviation and an ordinate indicating the projected line width L of the pattern transferred onto the wafer. Such curve is generally called as "CD - Focus Curve (Critical Dimension - Focus Curve). FIGS. 3A, 3B and 3C correspond to the aberration correction conditions of FIGS. 2A, 2B and 2C, respectively. In FIG. 3, the features of 0.8 $\mu$m line-and-space and of 1.6 $\mu$m line-and-space are shown a two patterns having different line widths.

As apparent from these Figures, with respect to the CD - Focus Curve regarding the line width of 1.6 $\mu$m, even if the aberration correction conditions are changed as shown in FIGS. 2A, 2B, 2C, the best focus position is merely deviated in the left-and-right direction (direction along the abscissa) slightly, the position on the ordinate and the shape of the curve are not so changed as much. However, with respect to the CD - Focus Curve regarding the line width of 0.8 $\mu$m, as shown in FIGS. 3A, 3B and 3C, the best focus position is greatly deviated in the left-and-right direction in accordance with the aberration correction conditions and the position on the ordinate and the shape of the curve are also changed.

Accordingly, as shown in FIG. 2A, in the so-called full correction condition that the amount of the spherical aberration regarding the peripheral light is corrected to zero ($\Delta S=0$), as shown in FIG. 3A, the bottom of the CD - Focus Curve regarding the line width of 0.8 $\mu$m is shallow on the ordinate, which indicates the fact that the resolving power is high. And, an area $\Delta DF_A$ of the focus deviation included in a range $\Delta L$ of the predetermined line width has some substantial extent. On the other hand, as shown in FIG. 2B, in the case where the amount $\Delta S$ of the spherical aberration is slightly excessively corrected ($\Delta S = \Delta S_B$), as shown in FIG. 3B, the bottom of the CD - Focus Curve regarding the line width of 0.8 $\mu$m is flattened, and an area $\Delta DF_B$ of the focus deviation included in a range $\Delta L$ of the predetermined line width becomes larger than $\Delta DF_A$ of FIG. 3A. In this case, since the resolving power is not so reduced as much, the bottom of the CD - Focus Curve can be maintained to be shallow in some extent on the ordinate, and the symmetry of the curve is also good.

Further, as shown in FIG. 2C, in the case where the amount of the spherical aberration is exceesively corrected greatly, of course, the resolving power is reduced. Consequently, as shown in FIG. 3C, the bottom of the CD - Focus Curve is relativley deep on the ordinate, and an area $\Delta DF_C$ of the focus deviation included in a range $\Delta L$ of the predetermined line width becomes considerably small. Further, in this case, at the same time, the symmetry of the CD - Focus Curve is also worsened, thus making the projection optical system unstable.

Furthermore, in FIGS. 3A, 3B and 3C, a line l connecting between the best focus positions of the patterns having 0.8 $\mu$m line-and-space and 1.6 $\mu$m line-and-space is shown, respectively. In FIG. 3A, the best focus position is shifted rightwardly (toward the plus direction) as the line width increases; whereas, in FIG. 3C, the best focus position is shifted leftwardly (toward the minus direction) as the line width increases. On the other hand, as shown in FIG. 3B, in the case where the spherical aberration is slightly excessively corrected, it is clear that the best focus position is not substantially changed and stable even if the line width changes.

As mentioned above, while the relation between the correction condition of the spherical aberration and the CD - Focus Curve varies in accordance with the illumination condition, NA of the projection optical system, the kinds of the wafer (to be exposed) and of the resist and the like, the above-mentioned tendency substantially remains as it is. By examining such relation between the correction condition of the spherical aberration and the CD - Focus Curve, the optimum range of the amount of the spherical aberration as indicated in the above relation (1) was found.

If the amount of the spherical aberration is below the lowermost limit of the relation (1), although the resolving power can be improved in some extent, the bottom of the CD - Focus Curve will be narrower, and the symmetry of the curve will be worsened. Consequently, in the cases where the line widths are different from each other, the best focus positions greatly differ from each other, with the result that it will be difficult to maintain the stability of the transfer regarding the reticle pattern having various minute pattern areas. On the other hand, if the amount of the spherical aberration is above the uppermost limit of the relation (1), the spherical aberration will be too excessive, with the result that the resolving power is reduced, and the bottom of the CD - Focus Curve will be narrow and the depth of focus will be shallow, and the symmetry of the curve will be worsened, and the best focus position varies as the line width changes. Consequently, it will be difficult to perform the transferring of the pattern having various minute pattern areas.

Incidentally, in each of the CD - Focus Curves shown in FIG. 3, the selection regarding the abscissa differs from ordinary indication of the aberration graphs as shown in FIG. 2, and, the plus (+) direction of the abscissa indicates a direction where the back focus of the projection objective lens is shortened (direction to which the stage 5 supporting the wafer is lifted) and the minus (−) direction of the abscissa indicates a direction where the back focus of the projection objective lens is lengthened (direction to which the stage 5 supporting the wafer is lowered).

Referring again to FIG. 1 showing the construction of the first embodiment, the illumination information such as the wavelength λ of the exposure light in the illumination optical device 1, NA of the illumination system and the like is inputted to a main controller 20 through an illumination information output device 11. On the other hand, the information of the projection pattern regarding the line width of the pattern formed on the reticle 3 is inputted to the main controller 20 through a pattern information output device 12. Further, the information regarding the member to be exposed (photosensitive substrate) such as material of the wafer, material of the photoresist, thickness, of the photoresist and the like is inputted to the main controller 20 through a photosensitive substrate information output device 14. In addition, the information regarding the aperture value (such as NA) of the reduction projection objective lens 4 is also inputted to the main controller 20 through an NA information output device 13.

On the basis of such various information, the main controller 20 seeks the optimum amount of the spherical aberration, and causes the aberration changing optical system 40 (fully described later) to generate a desired spherical aberration through an actuator 30, thereby creating a condition having a proper depth of focus according to the line width, as shown in FIG. 3B.

Further, on the basis of the information regarding the minuteness of the pattern on the reticle from the pattern information output device 12 and the information regarding the illumination condition such as wavelength λ of the exposure light, NA of the illumination optical device 1 from the illumination information output device 11, the main controller 20 calculates the optimum aperture value of the reduction projection objective lens 4, and causes an aperture controller 21 to set the optimum aperture value of the reduction projection objective lens 4. In this case, without using the aperture information output device 13, on the basis of the optimum aperture value calculated by the main controller 20, the aberration changing optical system 40 sets the excessive amount of the spherical aberration a the optimum value.

A parallel planar plate is used, as a preferred example of the aberration changing optical system according to the invention. And, the phenomenon that the plus spherical aberration is generated by passing the light through this parallel planar plate is utilized. That is to say, in a projection objective lens in which the aberration is ideally corrected, by inserting the parallel planar plate in the condensed or scatered light beams, it is possible to generate the spherical aberration excessively, and by changing the thickness of the parallel planar plate, it is possible to control the excessive amount of the spherical aberration at will.

Figure 4:
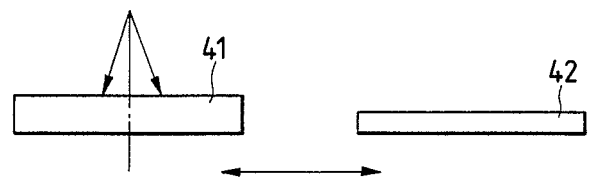
FIGS. 4, 5 and 6 are sectional views showing other embodiments of a spherical aberration changing optical system in FIG. 1, respectively.
Figure 5:
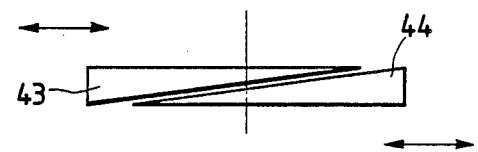
Figure 6:
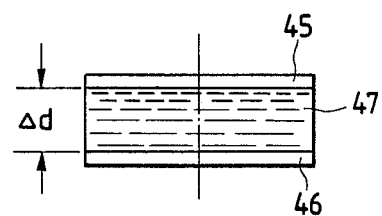

More specifically, as shown in FIG. 4, by inserting two parallel planar plates 41, 42 having different thicknesses in the light path alternatively, the amount of the spherical aberration is changed. Alternatively, as shown in FIG. 5, by shifting two wedged prisms 43, 44 in opposite directions, the combined thickness of the plate ma be changed. Furthermore, as shown in FIG. 6, by changing an amount of transparent liquid filled into the space defined between two parallel planar plates 45, 46 to change the distance between the plates, the substantial length of the light path between the plates can be changed to obtain the desired amount of the spherical aberration.

While the spherical aberration changing optical system 40 may comprise one of the above various concrete constructions, in every cases, it is desirable that the reduction projection objective lens 4 has a telecentric construction also in the side of the reticle 4, whereby the optical system is arranged in the reticle side of the objective lens, for the reason that, when the parallel planar plate is inserted into the telecentric light beams, only the spherical aberration can be changed without affecting the influence upon other aberrations (coma aberration, astigmatism or the like). Since the space between the projection objective lens and the wafer is generally constructed telecentrically, in the reduction projection exposure apparatus, it can be considered that the spherical aberration changing optical system is inserted in the wafer side of the projection objective lens. In this case, however, since the moving range of the projection objective lens is shortened, there arises the serious restriction or limitation in the optical design of the optical system for lengthening the moving range of the objective lens. Further, at the wafer side of the projection objective lens, since the NA (numerical aperture) is large, the severe tolerance is required for controlling the amount of the spherical aberration generated by the parallel planar plate, thus making such control difficult practically. Accordingly, when the spherical aberration changing optical system is arranged, it is desirable that both sides of the projection objective lens are constituted telecentrically.

As mentioned above, according to the projection exposure apparatus of the present invention, it is possible to transfer the minute pattern more stably, without reducing the resolving power of the projection optical system. Consequently, the load of the focus detecting device and of the focus position correcting device can be reduced, thus performing the exposure effectively with a simple construction, without decreasing the through-put, even when the minute pattern having different line widths is projected.

What is claimed is:

1. A projection exposure apparatus comprising:
   a reticle stage;
   an illumination optical system for illuminating a reticle on said reticle stage;
   a stage on which a substrate is supported; and
   a projection optical system having a predetermined numerical aperture to project a pattern formed on said reticle and illuminated by said illumination optical system onto said substrate, and in which a longitudinal spherical aberration thereof regarding the focusing of said pattern formed on said reticle onto said substrate is excessively corrected.

2. A projection exposure apparatus according to claim 1, wherein, when the numerical aperture of said projection optical system is NA and a wavelength of exposure light for illuminating said reticle is λ, an amount ΔS of said longitudinal spherical aberration meets the following relation:

$$0 < \Delta S < 5\lambda/NA^2.$$

3. A projection exposure apparatus comprising:
   a reticle stage;
   an illumination optical system for illuminating a reticle on said reticle stage;
   a stage on which a substrate is supported;
   a projection optical system having a predetermined numerical aperture to project a pattern formed on said reticle and illuminated by said illumination optical system onto said substrate; and
   an aberration changing means for changing an amount of a longitudinal spherical aberration regarding the focusing of said pattern formed on said reticle onto said substrate.

4. A projection exposure apparatus according to claim 3, wherein said aberration changing means changes said amount of the longitudinal spherical aberration so that, when the numerical aperture of said projection optical system is NA and a wavelength of exposure light for illuminating said reticle is λ, said amount ΔS meets the following relation:

$$0 < \Delta S < 5\lambda/NA^2.$$

5. A projection exposure apparatus according to claim 3, further including:
   means for outputting illumination information including an information with respect to a numerical aperture of said illumination optical system;
   means for outputting pattern information regarding line widths of the pattern formed on said reticle;
   means for outputting aperture information including an information with respect to the numeral aperture of said projection optical system;
   means for outputting substrate information regarding said substrate;
   determining means for determining an optimum amount of said spherical aberration on the basis of said illumination information, said pattern information, said aperture information and said substrate information; and
   means for actuating said aberration changing means in accordance with said optimum amount of the spherical aberration determined by said determining means.

6. A projection exposure apparatus according to claim 3, wherein said projection optical system is designed that a main light beam thereof is constructed as telecentric condition at both object side and image side, and said aberration changing means includes a plurality of transparent parallel planar plates having different thicknesses and replaceably arranged in a light path between said reticle and said substrate.

7. A projection exposure apparatus according to claim 3, wherein said projection optical sytem is designed that a main light beam thereof is constructed as parallel telecentric condition at both object side and image side, and said aberration changing means includes two wedged prisms arranged in a light path between said reticle and said substrate and capable of performing a relative movement to change a total thickness thereof.

8. A projection exposure apparatus according to claim 3, wherein said projection optical system is designed that a main light beam thereof is constructed as parallel telecentric condition at both object side and image side, and said aberration changing means includes two transparent planar plates arranged in parallel with each other and in a light path between said reticle and said substrate, and transparent liquid filled between said two planar plates, thereby changing a light path between said two planar plates by changing a distance between said two planar plates.

* * * * *